(12) United States Patent
Chang et al.

(10) Patent No.: US 10,638,624 B2
(45) Date of Patent: Apr. 28, 2020

(54) DISPLAY DEVICE

(71) Applicant: Qisda Corporation, Taoyuan (TW)

(72) Inventors: Yung-Yeh Chang, Taoyuan (TW); Ting-Hui Chih, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 0 days.

(21) Appl. No.: 16/193,042

(22) Filed: Nov. 16, 2018

(65) Prior Publication Data

US 2019/0223303 A1 Jul. 18, 2019

(30) Foreign Application Priority Data

Jan. 15, 2018 (CN) .......................... 2018 1 0034710

(51) Int. Cl.
| | | |
|---|---|---|
| *H05K 5/00* | (2006.01) | |
| *H05K 5/02* | (2006.01) | |
| *H04N 5/64* | (2006.01) | |
| *G06F 1/16* | (2006.01) | |
| *F16M 11/00* | (2006.01) | |

(52) U.S. Cl.
CPC ........... *H05K 5/0204* (2013.01); *F16M 11/00* (2013.01); *G06F 1/1601* (2013.01); *H04N 5/64* (2013.01); *H05K 5/0017* (2013.01)

(58) Field of Classification Search
None
See application file for complete search history.

(56) References Cited

U.S. PATENT DOCUMENTS

| | | | | |
|---|---|---|---|---|
| 5,947,440 A | * | 9/1999 | Cho ....................... | F16M 11/10 |
| | | | | 361/679.22 |
| 5,978,211 A | * | 11/1999 | Hong ..................... | F16M 11/10 |
| | | | | 361/679.23 |
| 6,094,340 A | * | 7/2000 | Min ................... | G02F 1/133308 |
| | | | | 361/679.22 |
| 6,268,997 B1 | * | 7/2001 | Hong ..................... | F16M 11/10 |
| | | | | 361/679.07 |
| 6,837,469 B2 | * | 1/2005 | Wu ....................... | F16M 11/126 |
| | | | | 248/278.1 |
| 7,744,045 B2 | * | 6/2010 | Akagawa ............... | F16M 11/10 |
| | | | | 248/121 |
| 7,748,680 B2 | * | 7/2010 | Choi ....................... | F16M 11/10 |
| | | | | 16/367 |
| 7,869,202 B2 | * | 1/2011 | Chiang ................. | G06F 1/1601 |
| | | | | 248/917 |

(Continued)

FOREIGN PATENT DOCUMENTS

| | | |
|---|---|---|
| CN | 103065550 A | 4/2013 |
| CN | 103824517 A | 5/2014 |

*Primary Examiner* — Jinhee J Lee
*Assistant Examiner* — Rashen E Morrison (57) ABSTRACT

A display device includes a display panel having a display surface and a rear surface opposite to the display surface, a rear casing having an opening disposed on the display panel to enclose an accommodation space with the rear surface of the display panel, a mounting plate partially inserted to the rear casing through the opening along the rear surface to be detachably disposed in the accommodation space, and a restricting member disposed in the accommodation space to limit movement of the mounting plate relative to the rear casing, wherein a vertical projection of the opening toward the display panel falls within the rear surface.

19 Claims, 8 Drawing Sheets

(56) References Cited

U.S. PATENT DOCUMENTS

| | | | | |
|---|---|---|---|---|
| 8,047,497 B2* | 11/2011 | Tai | ................ | F16M 11/00 248/346.03 |
| 8,094,243 B2* | 1/2012 | Yokawa | ................ | F16M 11/10 348/794 |
| 8,526,197 B2* | 9/2013 | Takashima | ............ | F16M 11/04 248/121 |
| 9,857,022 B2* | 1/2018 | Liu | ................ | F16M 11/38 |
| 2002/0130981 A1* | 9/2002 | Ma | ................ | F16M 11/10 348/843 |
| 2003/0230693 A1* | 12/2003 | Yen | ................ | A47B 49/00 248/346.3 |
| 2005/0157457 A1* | 7/2005 | Kim | ................ | G06F 1/1601 361/679.27 |
| 2006/0087596 A1* | 4/2006 | Park | ................ | F16M 11/22 348/739 |
| 2007/0023600 A1* | 2/2007 | Lee | ................ | F16C 11/10 248/288.11 |
| 2008/0043411 A1* | 2/2008 | Chih | ................ | F16M 11/2021 361/679.06 |
| 2008/0258030 A1* | 10/2008 | Hsuan | ................ | F16M 11/041 248/346.03 |
| 2011/0038129 A1* | 2/2011 | Hsu | ................ | G06F 1/1601 361/752 |
| 2011/0134359 A1* | 6/2011 | An | ................ | G06F 1/1601 349/61 |
| 2011/0316010 A1* | 12/2011 | Baba | ................ | G02F 1/133603 257/88 |
| 2014/0192505 A1* | 7/2014 | Jung | ................ | F16M 11/22 361/809 |
| 2014/0233259 A1* | 8/2014 | Jung | ................ | G02F 1/133308 362/607 |
| 2016/0353593 A1* | 12/2016 | Park | ................ | F16M 11/16 |
| 2017/0292691 A1* | 10/2017 | Coo | ................ | G02F 1/133308 |
| 2018/0063971 A1* | 3/2018 | Han | ................ | F16M 13/02 |
| 2019/0223303 A1* | 7/2019 | Chang | ................ | F16M 11/22 |

* cited by examiner

DISPLAY DEVICE

BACKGROUND OF THE INVENTION

1. Field of the Invention

The present invention generally relates to a display device. Particularly, the present invention relates to a display device having a detachable mounting plate.

2. Description of the Prior Art

With the advent of flat panel display devices, the installation of the display device adds more wall-mounted applications besides the traditional stand settings. However, the conventional display device is wall-mounted by forming a plurality of screw holes in the rear casing of the display device and then securing the display device to the external wall mount bracket by screws, so that the rear casing must have a certain thickness, resulting in no benefit to the thinning design. Moreover, the number of screw holes provided in the rear casing affects the outer appearance design of the rear casing, less attractive to user's aesthetic requirement.

SUMMARY OF THE INVENTION

It is an object of the invention to provide a display device, which has a detachable mounting plate, so the display device can be placed in different ways according to the user's preference.

It is another object of the invention to provide a display device, which has a stand for receiving the non-use mounting plate to solve the storage problem of the mounting plate and enhance the structural strength of the stand.

It is yet another object of the invention to provide a display device having a mounting plate, which is easily installed/detached and well supported to promote the mounting feasibility and supportability of the display device and enhance the outer appearance.

In an embodiment, the invention provides a display device including a display panel having a display surface and a rear surface opposite to the display surface, a rear casing disposed on the display panel to enclose an accommodation space with the rear surface of the display panel, the rear casing having an opening, a vertical projection of the opening toward the display panel falling within the rear surface, a mounting plate partially inserted to the rear casing through the opening along the rear surface to be detachably disposed in the accommodation space, and a restricting member at least partially disposed in the accommodation space to limit movement of the mounting plate relative to the rear casing.

In an embodiment, the rear casing has a first screw hole, the mounting plate has a second screw hole, and the restricting member is a screw. When the mounting plate is inserted to the rear casing, the screw is inserted to the second screw hole and the first screw hole to secure the mounting plate and the rear casing.

In an embodiment, the mounting plate has an engaging hole, and the restricting member includes an extension post with an engaging portion; when the mounting plate is inserted to the rear casing, the engaging portion engages with the engaging hole.

In an embodiment, the display device further includes a guiding part disposed in the accommodation space, wherein the guiding part limits lateral movement of the mounting plate relative to the opening.

In an embodiment, the display device further includes a supporting frame disposed on the rear surface of the display panel in the accommodation space. The extension post is disposed on the supporting frame and extends along an insertion direction of the mounting plate into the opening.

In an embodiment, the rear casing has a through hole, the extension post further has a pressing portion, and the pressing portion is exposed from the rear casing through the through hole. When exerting a force to the pressing portion, the extension post moves relative to the rear casing to drive the engaging portion to disengage from the engaging hole, so the mounting plate is allowed to be retreated from the rear casing through the opening.

In an embodiment, the supporting frame further includes a guiding part to limit lateral movement of the mounting plate relative to the opening.

In an embodiment, the guiding part includes a guiding groove and a blocking portion. The guiding groove communicates with the opening. The mounting plate moves along the guiding groove relative to the opening, and the blocking portion is disposed at one end of the guiding groove opposite to the opening to block the mounting plate.

In an embodiment, the display device further includes a reinforcement plate covering the guiding part to enhance the structural strength of the guiding part.

In an embodiment, the display device further includes a shielding member movably disposed on the rear casing to selectively shield or expose the opening.

In an embodiment, the rear casing further has a first positioning hole located at one side of the opening and a second positioning hole located away from the first positioning hole at another side of the opening. The shielding member has a positioning protrusion. One end of the shielding member is rotatably connected to the opening, so the positioning protrusion selectively engages with the first positioning hole or the second positioning hole to shield or expose the opening.

In an embodiment, the display device further includes a stand detachably connected to the rear casing to support the display panel on a supporting surface.

In an embodiment, the stand has a receiving portion. When the stand supports the display panel on the supporting surface, the mounting plate is allowed to be retreated from the rear casing and received in the receiving portion.

In an embodiment, the rearing casing only covers a lower portion of the rear surface of the display panel. The rear casing has an upper surface, and the opening is located at the upper surface to allow the mounting plate to be inserted into the opening along the rear surface from up to down.

In an embodiment, the screw has a first thread portion and a second thread portion located a distance away from the first thread portion. The distance corresponds to a gap between the first screw hole and the second screw hole.

In an embodiment, the mounting plate has at least one mounting hole. When the mounting plate is inserted to the rear casing, the at least one mounting hole is located outside the rear casing.

Compared to the prior art, the display device of the invention has the mounting plate inserted into the opening of the rear casing from up to down and secured, so the display device can be wall-mounted by means of the mounting plate. Moreover, the display device of the invention utilizes a multiple-point supported mounting plate to enhance the support of the mounting plate and utilizes a stand capable of accommodating the non-use mounting plate so as to solve the storage issue of the mounting plate and enhance the structural strength of the stand.

DETAILED DESCRIPTION OF THE PREFERRED EMBODIMENT

The invention provides a display device with a detachable mounting plate, which is easily installed/detached and enables the display device to be placed in different ways based on the user's preference. The display device of the invention is preferably a flat display device, which can be, for example, a display for the information processing device such as computer host, but not limited thereto. In another embodiment, the display device can be an independent display, such as an information-processing-function built-in display device, television, etc. Hereafter, the display device of the invention will be described in detail with reference to the drawings.

Figure 1A:
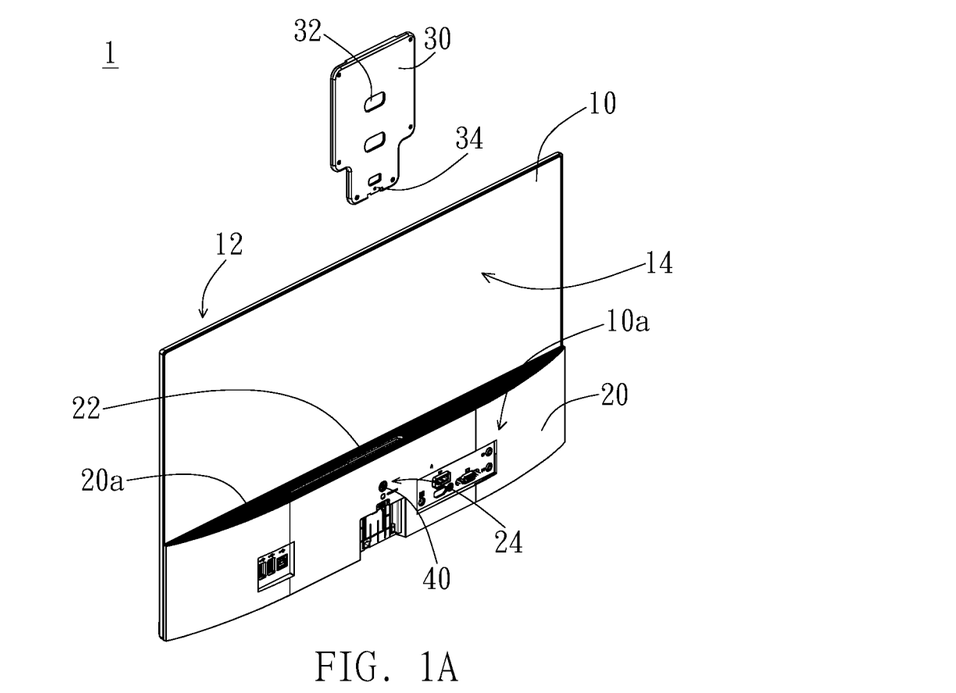
FIGS. 1A and 1B are schematic views of an embodiment of the display device of the invention before and after the mounting plate is inserted to the rear casing, respectively.
Figure 1B:
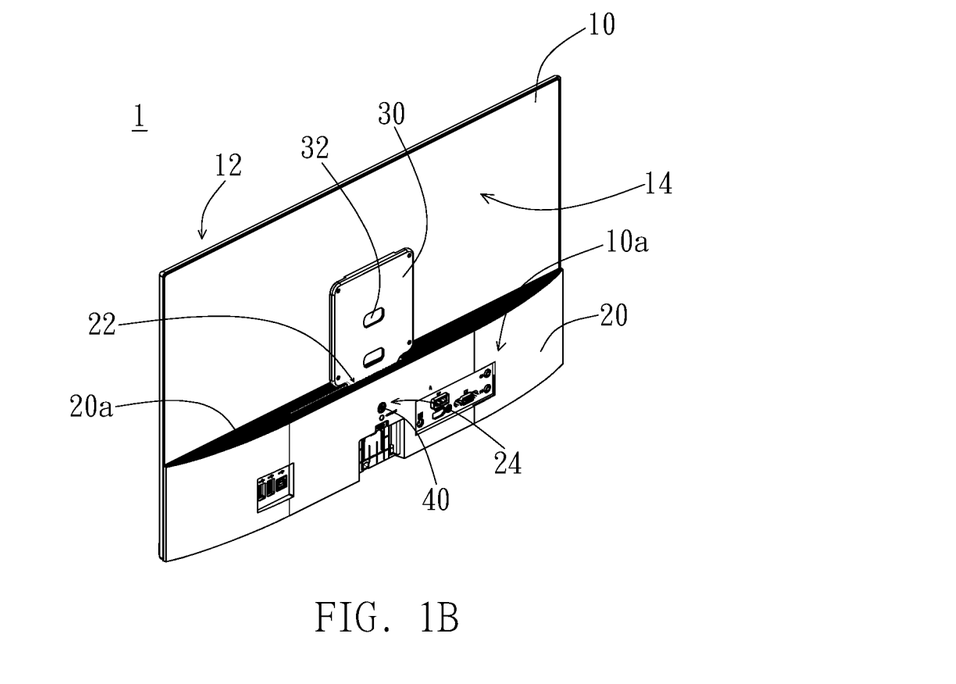

As shown in FIGS. 1A and 1B, in an embodiment, the display device 1 of the invention includes a display panel 10, a rear casing 20, a mounting plate 30, and a restricting member. The display panel 10 has a display surface 12 and a rear surface 14 opposite to the display surface 12. The rear casing 20 is disposed on the display panel 10 to enclose an accommodation space 10a with the rear surface 14 of the display panel 10. The rear casing 20 has an opening 22, wherein a vertical projection of the opening 22 toward the display panel 10 falls within the rear surface 14. The mounting plate 30 is partially inserted to the rear casing 20 through the opening 22 along the rear surface 14 to be detachably disposed in the accommodation space 10a. The restricting member is at least partially disposed in the accommodation space 10a to limit movement of the mounting plate 30 relative to the rear casing 20.

Specifically, the display panel 10 is preferably a flat display panel including but not limited to a liquid crystal display panel, an organic light-emitting diode display panel, an inorganic light-emitting diode display panel, a quantum dot light-emitting diode display panel, an electrophoretic display panel, or any other suitable display panels. The display surface 12 refers to a surface of the display panel 10 that faces the user and displays information, and the rear surface 14 refers to a surface of the display panel 10 that faces away from the user.

The rear casing 20 is disposed on the display panel 10, so the rear casing 20 and the rear surface 14 of the display panel 10 together enclose the accommodation space 10a for accommodating components of the display device 1. For example, the rear casing 20 can be a casing with a recessed space. When the rear casing 20 is attached to the display panel 10 by, for example, screwing, engaging, or adhering, the rear surface 14 of the display panel 10 covers from the opening direction of the recessed space, i.e. covers the recessed space of the rear casing 20, so that the recessed space of the rear casing 20 becomes a substantially enclosed accommodation space 10a. In an embodiment, the rear casing 20 can be a casing made of plastics or metals, and the rearing casing 20 preferably only covers a lower portion of the rear surface 14 of the display panel 10, so that the display device 1 can have a slim appearance and is light-weighted. The rear casing 20 has an upper surface 20a. The opening 22 is located at the upper surface 20a to allow the mounting plate 30 to be inserted into the opening 22 from up to down. In this embodiment, the upper surface 20a is preferably a surface having a normal direction parallel to an insertion direction of the mounting plate 30, but not limited thereto. In another embodiment, the rear casing 20 can substantially cover the entire rear surface 14 of the display panel 20, and the opening 22 can be disposed at any suitable location of the rear casing 20, so that the mounting plate 30 can be inserted into the opening 22 along the rear surface 14 of the display panel 10 from up to down. The opening 22 of the rear casing 20 is preferably designed in a manner that the vertical projection of the opening 22 toward the display panel 10 falls within the rear surface 14. That is, the location of the opening 22 on the rear casing 20 is preferably within a range of the rear surface 14 in the height direction of the display panel 10. For example, when the mounting plate 30 is partially inserted to the rear casing 20 through the opening 22 to be in the accommodation space 10a, the portion of the mounting plate 30 that is exposed outside the rear casing 20 is preferably substantially located at the middle or upper middle with respect to the height of the display panel 10, so that the display device 1 can have a better supportability when being wall-mounted, but not limited thereto.

The mounting plate 30 is a substantially flat plate with suitable structural strength and preferably made of metals, such as iron plate, stainless steel plate, but not limited thereto. In another embodiment, the mounting plate 30 can be made of plastics. Moreover, the mounting plate 30 can have different shapes according to practical applications, such as L shape, U shape. The mounting plate 30 has at least one mounting hole 32. When the mounting plate 30 is partially inserted to the rear casing 20, the at least one mounting hole 32 is located outside the rear casing 20. For example, the mounting plate 30 has two mounting holes 32, and the two mounting holes 32 are disposed along the insertion direction, e.g. from up to down, but not limited thereto. In another embodiment (not shown), the two mounting holes 32 of the mounting plate 30 can be disposed at two sides with respect to the insertion direction, e.g. disposed at the left hand side and the right hand side. Moreover, in this embodiment, though only one mounting plate 30 is illustrated, the number of the mounting plate 30 can be more than one according to practical applications. For example, two mounting plates can be disposed side by side. In addition, the number of the mounting holes 32 is not limited to two, which can be increased or decreased according to practical applications.

When the mounting plate 30 is partially inserted to and received in the accommodation space 10a, the restricting member is configured to limit the movement of the mounting plate 30 relative to the rear casing 20. In this embodiment, the restricting member can be a screw 40. Correspondingly, the rear casing 20 has a first screw hole 24, and the mounting plate 30 has a second screw hole 34. When the mounting plate 30 is partially inserted to the rear casing 20, the screw 40 is inserted to the first screw hole 24 and the second screw hole 34 to secure the mounting plate 30 and the rear casing 20, so that the display device 1 can be wall-mounted by means of the mounting plate 30.

Figure 2:
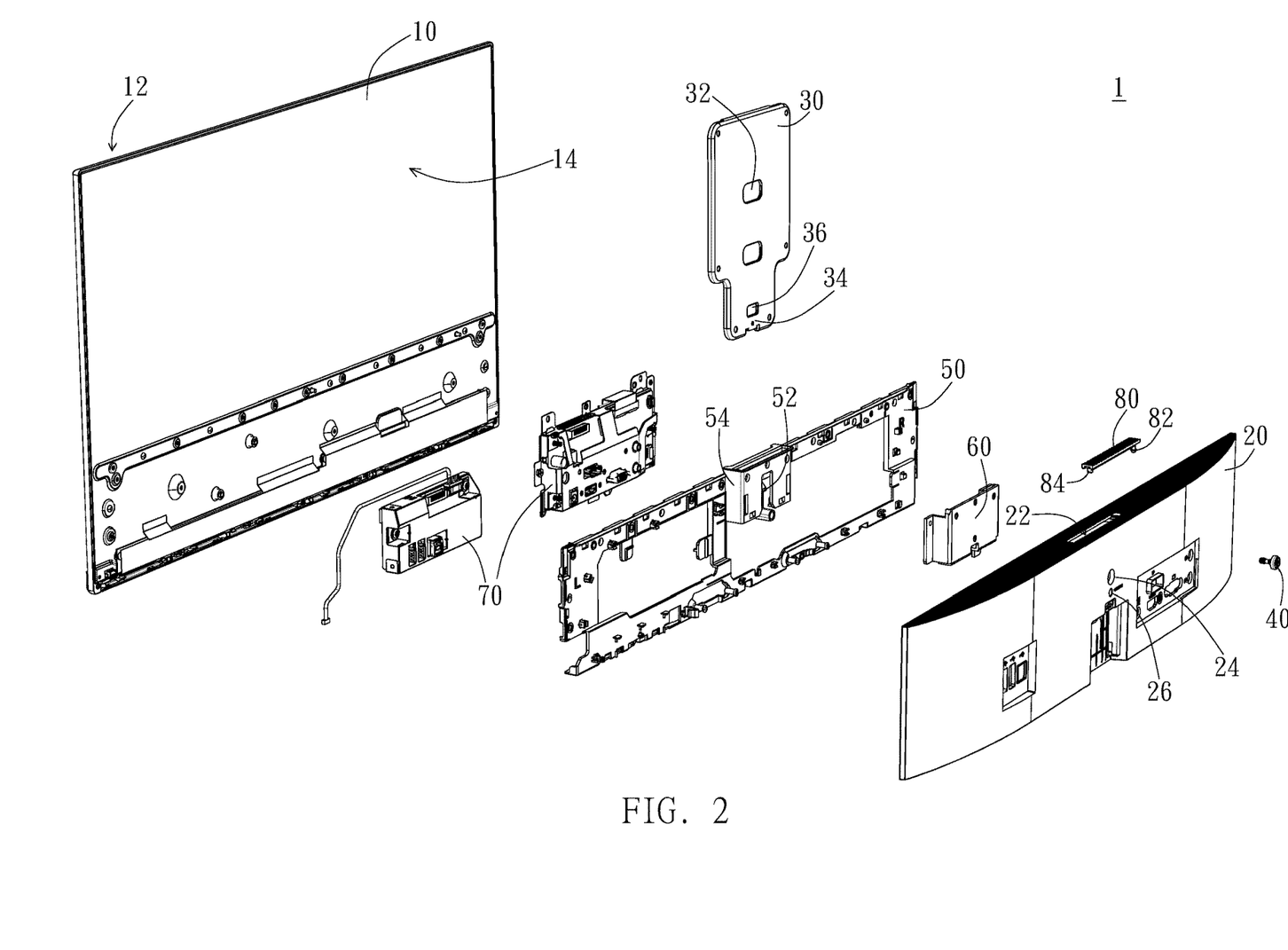
FIG. 2 is a schematic exploded view of an embodiment of the display device of the invention.

It is noted that the restricting member can be implemented in different ways and not limited to the screw 40, and the type or number of the restricting member is not limited to one. As shown in FIG. 2, in an embodiment, in addition to the display panel 10, the rear casing 20, the mounting plate 30, and the screw 40 described above, the display device 1 further includes a supporting frame 50, a reinforcement plate 60, electronic components 70, and a shielding member 80. The supporting frame 50 is disposed on the rear surface 14 of the display panel 10 in the accommodation space 10a. The supporting frame 50 can be configured to support the functional electronic components 70. The reinforcement plate 60 covers partial structure of the supporting frame 50 to locally enhance the structural strength of the supporting frame 50. The shielding member 80 is movably disposed on the rear casing 20 to selectively shield or expose the opening 22. The supporting frame 50, the reinforcement plate 60, and the shielding member 80 will be described in detail.

Figure 3A:
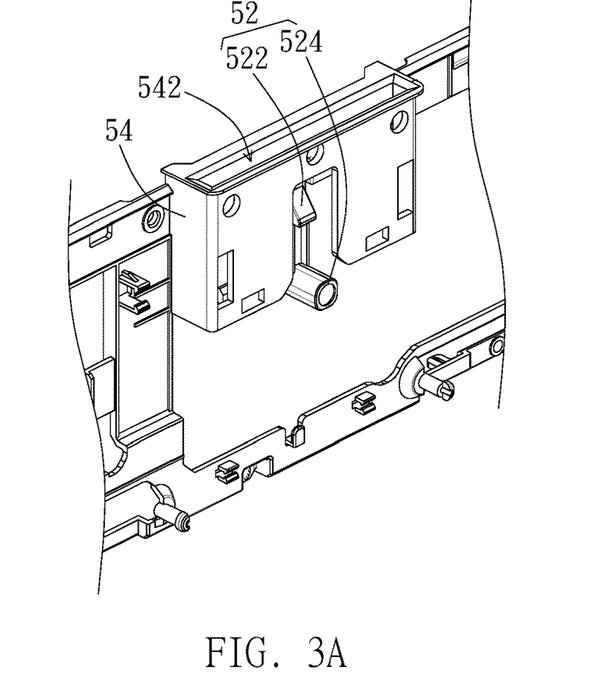
FIGS. 3A and 3B are partially enlarged views of the supporting frame of FIG. 2 from different viewing angles.
Figure 3B:
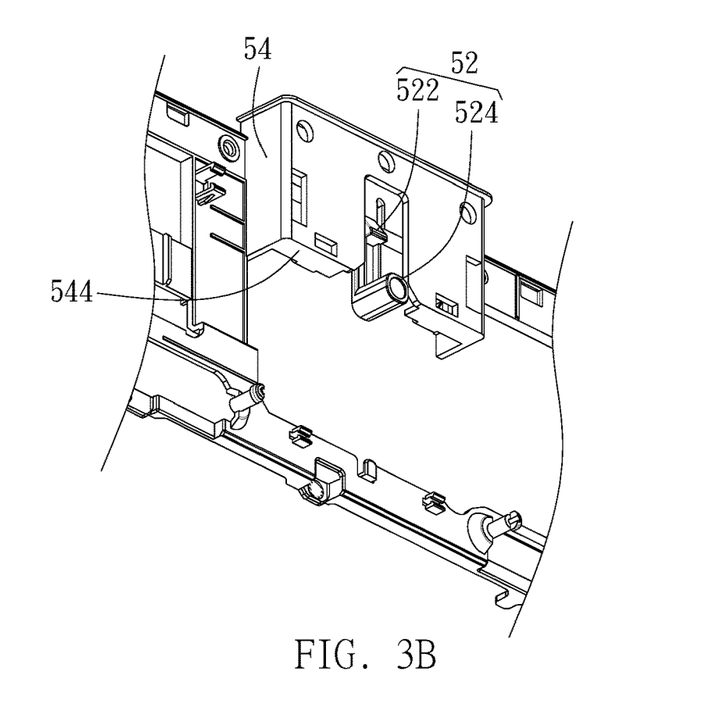

Referring to FIG. 2 and FIGS. 3A-3B, FIGS. 3A and 3B are partially enlarged views of the supporting frame 50 from different viewing angles. Specifically, the supporting frame 50 can be made of plastics or metals, and the supporting frame 50 can be attached to the rear surface 14 of the display panel 10 by screwing, engaging, adhering, etc. When the rear casing 20 is disposed on the display panel 10, the rear casing 20 preferably covers the supporting frame 50, so that the supporting frame 50 is substantially located within the accommodation space 10a and the outer appearance is promoted. In this embodiment, the mounting plate 30 preferably has an engaging hole 36, and the rear casing 20 has a through hole 26. Preferably, the supporting frame 50 has an extension post 52. The extension post 52 is preferably a flexible post that extends from top end of the supporting frame 50 along the insertion direction, e.g. extends downward. The extension post 52 has an engaging portion 522 and a pressing portion 524. The engaging portion 522 and the pressing portion 524 are disposed along the extension direction of the extension post 52, and the pressing portion 524 is closer to the distal end of the extension post 52 than the engaging portion 522. For example, the engaging portion 522 can be a hook or a bump protruding from the extension post 52 toward the rear casing 20, and the pressing portion 524 can be a protrudent rod protruding toward the rear casing 20. When the mounting plate 30 is partially inserted to the rear casing 20, the engaging portion 522 engages with the engaging hole 36 to serve as the restricting member and to limit the mounting plate 30 moving relative to the rear casing 20, and the pressing portion 524 is exposed from the rear casing 20 through the through hole 20 for the user to operate.

In this embodiment, the supporting frame 50 further has a guiding part 54 to limit lateral movement of the mounting plate 30 relative to the opening 22. The guiding part 54 is preferably a guiding structure and includes a guiding groove 542 and a blocking portion 544. The guiding groove 542 communicates with the opening 22, so that the mounting plate 30 moves along the guiding groove 542 relative to the opening 22 to be disposed in or escape from the accommodation space 10a. The blocking portion 544 is disposed at one end of the guiding groove 542 opposite to the opening 22 to block the mounting plate 30. For example, the guiding part 54 can be a frame-like portion, which extends downward from the top end of the supporting frame 50 to define the guiding groove 542, and the extension post 52 is located in the guiding groove 542 and is movable relative to the rear casing 20. The size of the guiding groove 542 preferably corresponds to the size of the opening 22 that allows the mounting plate 30 to be inserted thereto, so as to limit lateral movement of the mounting plate 30, e.g. the movement toward the left hand side or the right hand side. The blocking portion 544 can be disposed at the bottom of the guiding groove 542 to block the mounting plate 30 from moving further downward and to support (or position) the mounting plate 30. For example, the blocking portion 544 can be a bottom plate of the frame like portion that defines the guiding groove 542, but not limited thereto. In another embodiment (not shown), the guiding part 54 can be a guiding structure constituted by a plurality of rods or plates to define the movement range of the mounting plate 30 in different directions, such as the downward moving distance, the shift amount toward left or right, so as to guide the movement of the mounting plate 30.

As shown in FIG. 2, the reinforcement plate 60 preferably covers the guiding part 54 to enhance the structural strength of the guiding part 54, so as to promote the connection strength of the mounting plate 30 and the rearing casing 20 as well as the supporting frame 50. The reinforcement plate 60 is preferably a metal plate, such as iron plate, stainless steel plate, and the reinforcement plate 60 can be combined with the supporting frame 50 by screwing, engaging, or adhering to enhance the structural strength of the guiding part 54.

Figure 4A:
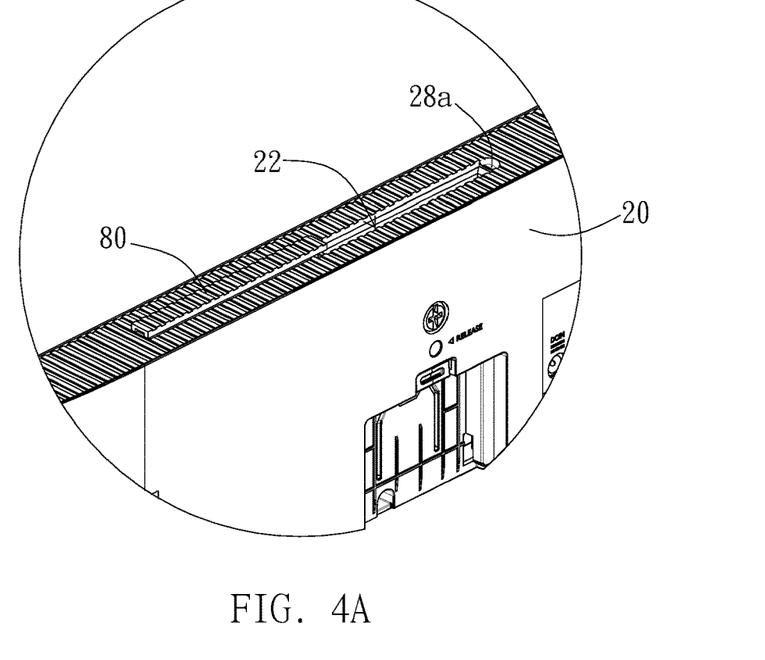
FIGS. 4A and 4B are schematic views of the shielding member exposing and shielding the opening of FIG. 2, respectively.
Figure 4B:
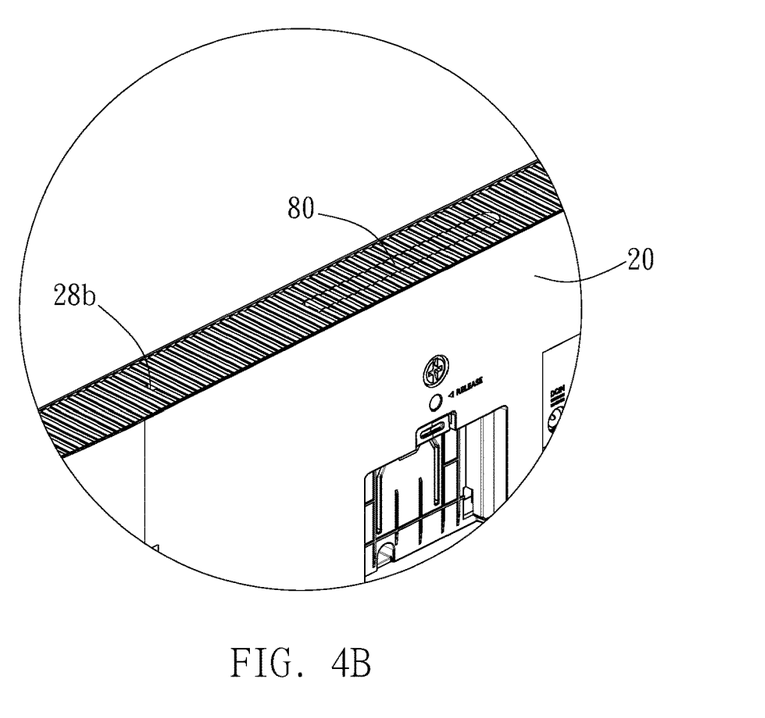

As shown in FIG. 2 and FIGS. 4A and 4B, the shielding member 80 is movably disposed on the rear casing 20 to selectively shield or expose the opening 22. In an embodiment, the shielding member 80 can be an embellishment bar. When the mounting plate 30 is detached from the rear casing 20, the shielding member 80 preferably covers the opening 22 to substantially form an integral surface with the upper surface 20a of the rear casing 20, so that the outer appearance of the display device 1 can be enhanced. Specifically, the shielding member 80 can be made of plastics, rubbers, etc. The shielding member 80 has a positioning protrusion 82 and a connection portion 84 on two opposite ends. The rear casing 20 correspondingly has a first positioning hole 28a and a second positioning hole 28b. The first positioning hole 28a is located at one side of the opening 22, and the second positioning hole 28b is located away from the first positioning hole 28a at another side of the opening 22. For example, the distance between the first positioning hole 28a and the second positioning hole 28b is about two times of the length of the shielding member 80. Therefore, when one end of the shielding member 80 is rotatably connected to the opening 22 by means of the connection portion 84, the positioning protrusion 82 of the shielding member 80 can selectively engage with the first positioning hole 28a or the second positioning hole 28b to shield or expose the opening 22. As shown in FIG. 4B, when the shielding member 22 shields the opening 22 by engaging the positioning protrusion 82 with the first positioning hole 28a, dusts or contaminants can be prevented from entering the accommodation space 10a through the opening 22, and the outer appearance can also be enhanced. As shown in FIG. 4A, when the shielding member 22 exposes the opening 22 by engaging the positioning protrusion 82 with the second positioning hole 28b, the mounting plate 30 is allowed to be inserted to the accommodation space 10a from the opening 22 of the rear casing 20, and the shielding member 80 is prevented from swinging with loosening end.

Figure 5A:
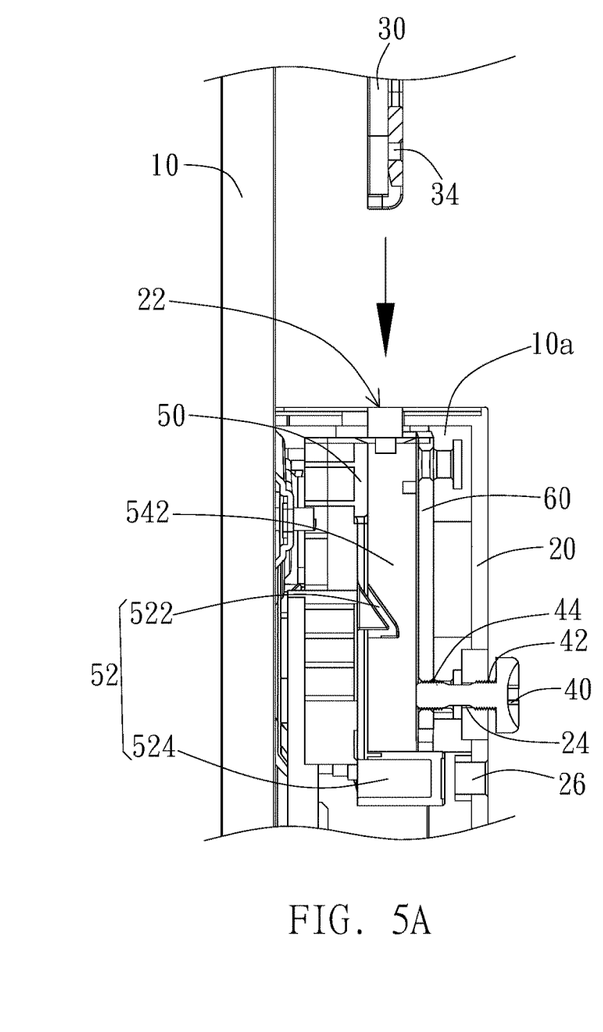
FIGS. 5A and 5B are schematic cross-sectional views of an embodiment of the display device of the invention before and after the mounting plate is inserted into the rear casing, respectively.
Figure 5B:
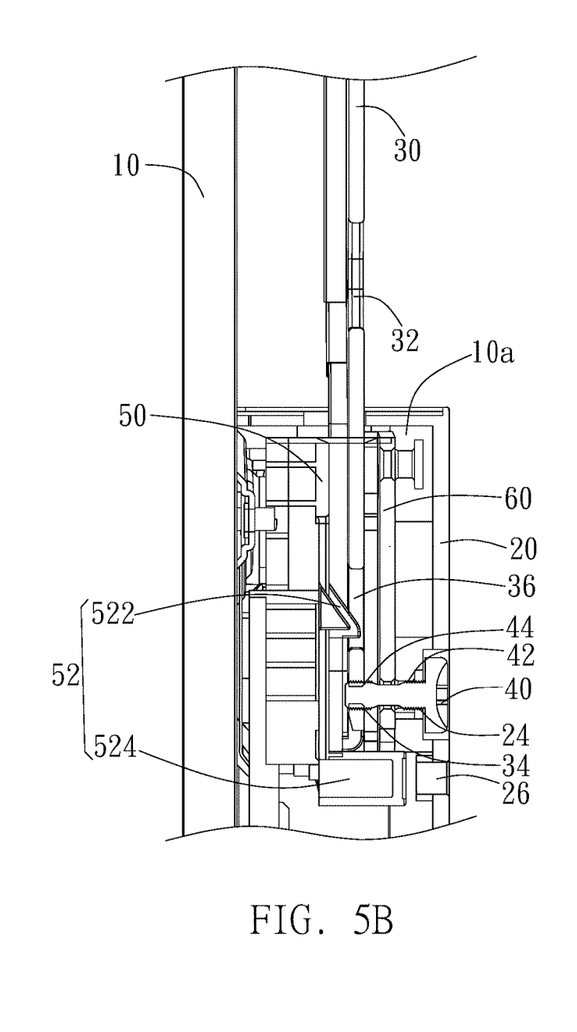

Referring to FIGS. 5A and 5B, the operation of the mounting plate 30 will be described. In this embodiment, the screw 40 has a first thread portion 42 and a second thread portion 44 located a distance away from the first thread portion 42. The distance between the first thread portion 42 and the second thread portion 44 corresponds to a gap between the first screw hole 24 and the second screw hole 34. For example, the first thread portion 42 is secured to the first screw hole 24, and the second thread portion 44 is secured to the second screw hole 34. The gap between the first screw hole 24 and the second screw hole 34 is substantially the location of the supporting frame 50 and the reinforcement plate 60. By this configuration, when the screw 40 is secured to the rearing casing 20 and the mounting plate 40, the screw 40 is prevented from being stuck and immovable. As shown in FIG. 5A, when the mounting plate 30 is inserted to the accommodation space 10a from the opening 22, the screw 40 can retreat to the first position, e.g. a position that the second thread portion 44 retreats from the guiding groove 542 and the screw 40 is still in the first screw hole 24 of the rear casing 20. As such, the mounting plate 30 can move downward along the rear surface 14 of the display panel 10 into the opening 22 and further along the guiding groove 542 to be interposed between the supporting frame 50 and the rear casing 20. When the bottom of the mounting plate 30 is in contact with the engaging portion 522, the mounting plate 30 pushes the extension post 52 along the slanted surface of the engaging portion 522, so the extension post 52 moves away from the rear casing 20. When the mounting plate 30 continues moving downward till the engaging hole 36 corresponding to the engaging portion 522, without the pushing force, the engaging portion 522 returns its original position to engage with the engaging hole 36 of the mounting plate 30. As such, the mounting plate 30 is fixed in the accommodation space 10a, and the movement of the mounting plate 30 relative to the rear casing 20 is restricted.

As shown in FIG. 5B, when the mounting plate 30 is partially inserted into the accommodation space 10a, the screw 40 can be moved toward the mounting plate 30 to a second position, i.e. the position that the screw 40 is secured to the second screw hole 34, to further secure the mounting plate 30. In addition, by means of the positioning mechanism of the engaging portion 522 and the screw 40 and incorporation with the design of the guiding groove 542 and the blocking portion 544 of the guiding part 54, the mounting plate 30 can be supported/hold at multiple points to enhance the connection strength and the supportability of the mounting plate 30. When the mounting plate 30 is to be detached, the screw 40 is loosen and moves to the first position described above, and the pressing portion 524 can be pressed to cause the extension post 52 moves relative to the rear casing 20 to drive the engaging portion 522 to disengage from the engaging hole 36, so that the mounting plate 30 is allowed to be retreated from the rear casing 20 through the opening 22. Specifically, when the screw 40 moves to the first position, the interference between the screw 40 and the mounting plate 30 is released. In such configuration, when exerting a force on the pressing portion 524 which is exposed from the through hole 26, the force exerted on the pressing portion 524 enables the entire extension post 52 moving away from the rear casing 20, so that the engaging portion 522 retreats from the engaging hole 36 to release the interference between the engaging portion 522 and the mounting plate 30 and allow the mounting plate 30 to move upward out of the rear casing 20 from the opening 22.

Figure 6A:
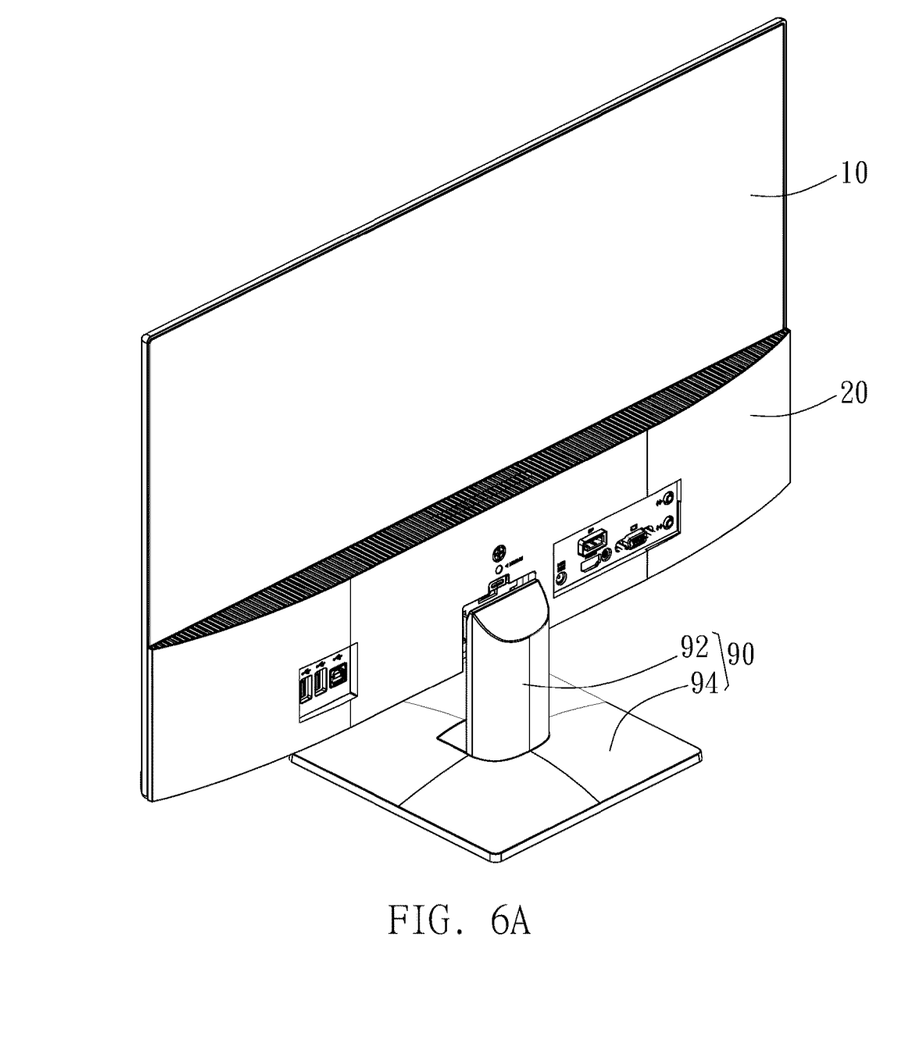
FIGS. 6A and 6B are schematic views of the display device supported by a stand from different viewing angles.
Figure 6B:
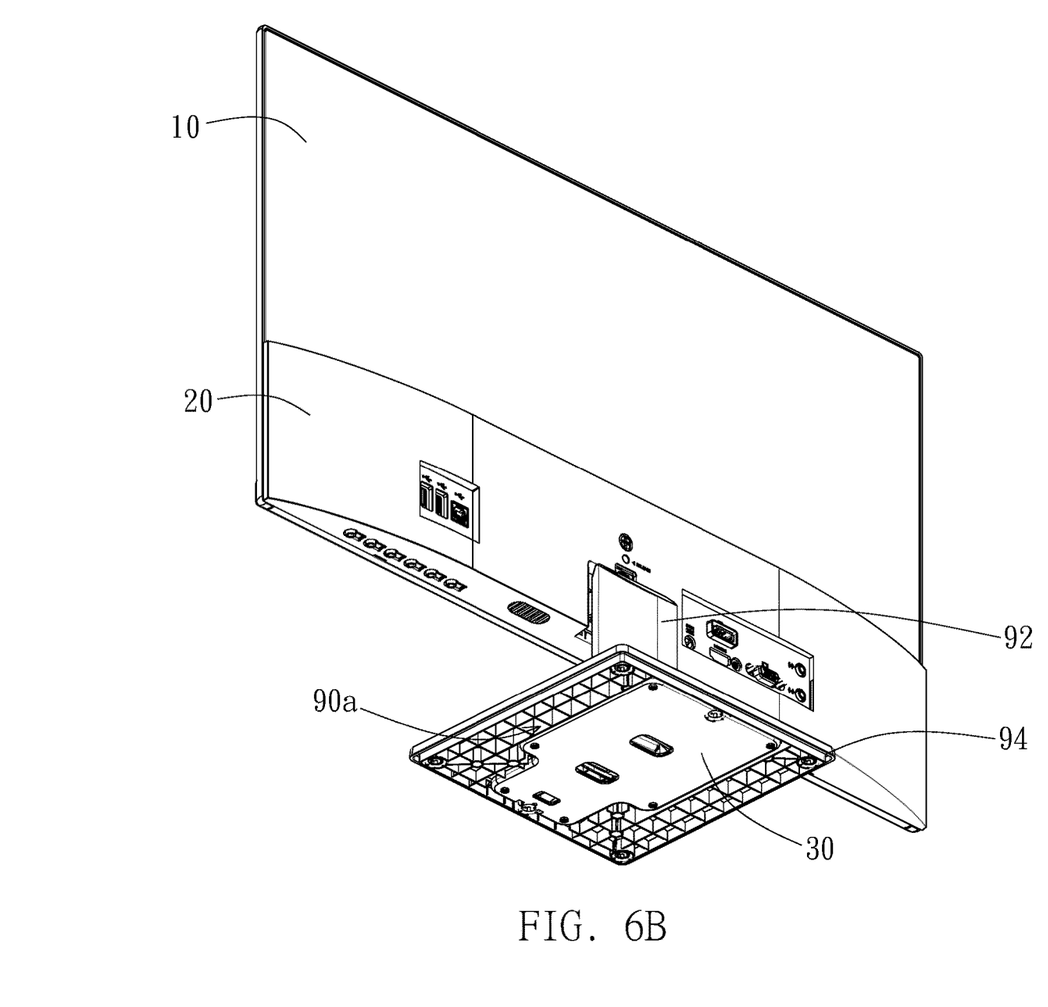

As shown in FIGS. 6A and 6B, the display device further includes a stand 90. The stand 90 is detachably connected to the rear casing 20 to support the display panel 10 on a supporting surface, such as table surface. The stand 90 has a receiving portion 90a. When the stand 90 supports the display panel 10 on the supporting surface, the mounting plate 30 is allowed to be detached from the rear casing 20 and received in the receiving portion 90a. For example, the stand 90 can include a supporting column 92 and a base 94. One end of the supporting column 92 is connected to the rear casing 20 and the other end of the supporting column 92 is connected to the base 94. The supporting column 92 can be detachably connected to the rear casing 20 and the base 94 by screwing, engaging, etc. Alternatively, the supporting column 92 and the base 94 of the stand 90 can be integrally formed. The receiving portion 90a is preferably disposed on the base 94. For example, the bottom of the base 94 can be recessed to form a receiving space as the receiving portion 90a for accommodating the mounting plate 30. When the display device is supported on the supporting surface by the stand 90, the non-used mounting plate 30 can be detachably received in the receiving portion 90a of the base 94 by engaging or screwing, so as not only to enhance the structural strength of the stand 90, but also to solve the storage problem of the non-use mounting plate 30, reduce the possibility of losing the non-use mounting plate 30, and enhance the outer appearance of the display device.

Figure 7:
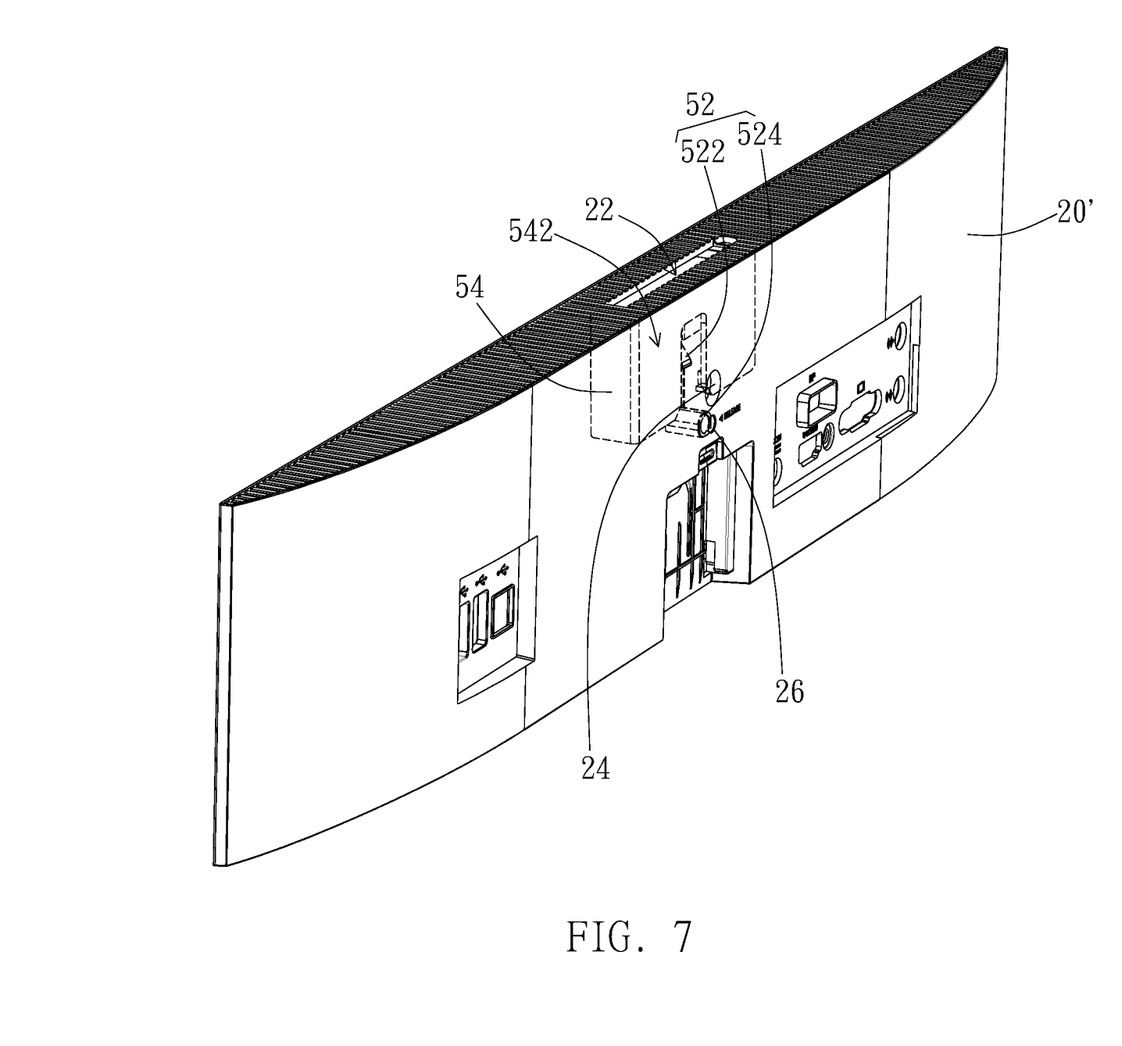
FIG. 7 is a schematic view of another embodiment of a rear casing of the display device of the invention.

It is noted that in the above embodiment, the extension post 52 and the guiding part 54 are disposed on the supporting frame 50, but not limited thereto. According to practical applications, the extension post 52 and the guiding part 54 can be disposed on any suitable components of the display device 1, such as disposed on the rear casing 20' shown in FIG. 7, to be located at corresponding positions in the accommodation space 10a. Specifically, as shown in FIG. 7, in another embodiment, the extension post 52 can be disposed at one side of the opening 22 on the rear casing 20 and extend along the insertion direction of the mounting plate 30, e.g. extend downward, and the guiding part 54 is preferably disposed on the rear casing 20 to surround the opening 22 to allow the engaging portion 522 to be located in the guiding groove 542 and the pressing portion 524 to correspond to the through hole 26 of the rear casing 20. One end of the guiding groove 542 can serve as the opening 22. As such, when the mounting plate 30 is partially inserted to the rear casing 20, the engaging portion 522 engages with the engaging hole 36 of the mounting plate 30, and the movement of the mounting plate 30 relative to the rear casing 20 is limited. The pressing portion 524 corresponds to the though hole 26 and is exposed from the rear casing 20. When exerting a force to the pressing portion 524, the extension post 52 moves relative to the rear casing 20 to disengage the engaging portion 522 from the engaging hole 36 of the mounting plate 30. It noted that the structural details of the extension post 52 and the guiding part 54 as well as their operations with the mounting plate 30 can be referred to the related descriptions of the previous embodiments and will not elaborate again.

Moreover, in the previous embodiment, the screw and the engaging portion are both implemented as the restricting member, but not limited thereto. In other embodiments, according to the practical applications and the structural strength requirement, the mounting plate can be secured by only the screw or the engaging portion.

Although the preferred embodiments of present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. A display device, comprising:
   a display panel having a display surface and a rear surface opposite to the display surface;
   a rear casing disposed on the display panel to enclose an accommodation space with the rear surface of the display panel, the rear casing having an opening and a first screw hole, a vertical projection of the opening toward the display panel falling within the rear surface;
   a mounting plate partially inserted to the rear casing through the opening along the rear surface to be detachably disposed in the accommodation space, the mounting plate having a second screw hole; and
   a restricting member at least partially disposed in the accommodation space to limit movement of the mounting plate relative to the rear casing, wherein the restricting member comprises a screw; when the mounting plate is inserted to the rear casing, the screw is inserted to the second screw hole and the first screw hole to secure the mounting plate and the rear casing.

2. The display device of claim 1, wherein the mounting plate has an engaging hole, and the restricting member further includes an extension post with an engaging portion; when the mounting plate is inserted to the rear casing, the engaging portion engages with the engaging hole.

3. The display device of claim 1, further comprising a guiding part disposed in the accommodation space, wherein the guiding part limits lateral movement of the mounting plate relative to the opening.

4. The display device of claim 3, wherein the guiding part includes a guiding groove and a blocking portion, the guiding groove communicates with the opening, the mounting plate moves along the guiding groove relative to the opening, and the blocking portion is disposed at one end of the guiding groove opposite to the opening to block the mounting plate.

5. The display device of claim 3, further comprising a reinforcement plate covering the guiding part to enhance structural strength of the guiding part.

6. The display device of claim 2, further comprising a supporting frame disposed on the rear surface of the display panel in the accommodation space; the extension post is disposed on the supporting frame and extends along an insertion direction of the mounting plate into the opening.

7. The display device of claim 2, wherein the rear casing has a through hole, the extension post further has a pressing portion, and the pressing portion is exposed from the rear casing through the through hole; when exerting a force to the pressing portion, the extension post moves relative to the rear casing to drive the engaging portion to disengage from the engaging hole, so the mounting plate is allowed to be retreated from the rear casing through the opening.

8. The display device of claim 1, further comprising a supporting frame disposed on the rear surface of the display panel in the accommodation space, wherein the mounting plate has an engaging hole, the supporting frame has an extension post with an engaging portion; when the mounting plate is inserted to the rear casing, the engaging portion engages with the engaging hole.

9. The display device of claim 8, wherein the rear casing has a through hole, the extension post further has a pressing portion, and the pressing portion is exposed from the rear casing through the through hole; when exerting a force to the pressing portion, the extension post moves relative to the rear casing to drive the engaging portion to disengage from the engaging hole.

10. The display device of claim 6, wherein the supporting frame further has a guiding part to limit lateral movement of the mounting plate relative to the opening.

11. The display device of claim 10, wherein the guiding part includes a guiding groove and a blocking portion, the guiding groove communicates with the opening, the mounting plate moves along the guiding groove relative to the opening, and the blocking portion is disposed at one end of the guiding groove opposite to the opening to block the mounting plate.

12. The display device of claim 10, further comprising a reinforcement plate covering the guiding part to enhance structural strength of the guiding part.

13. The display device of claim 1, further comprising a shielding member movably disposed on the rear casing to selectively shield or expose the opening.

14. The display device of claim 13, wherein the rear casing further has a first positioning hole located at one side of the opening and a second positioning hole located away from the first positioning hole at another side of the opening; the shielding member has a positioning protrusion, one end of the shielding member is rotatably connected to the opening, so the positioning protrusion selectively engages with the first positioning hole or the second positioning hole to shield or expose the opening.

15. The display device of claim 1, further comprising a stand detachably connected to the rear casing to support the display panel on a supporting surface.

16. A display device, comprising:
    a display panel having a display surface and a rear surface opposite to the display surface;
    a rear casing disposed on the display panel to enclose an accommodation space with the rear surface of the display panel, the rear casing having an opening, a vertical projection of the opening toward the display panel falling within the rear surface;
    a mounting plate partially inserted to the rear casing through the opening along the rear surface to be detachably disposed in the accommodation space;
    a restricting member at least partially disposed in the accommodation space to limit movement of the mounting plate relative to the rear casing; and
    a stand detachably connected to the rear casing to support the display panel on a supporting surface,
    wherein the stand has a receiving portion; when the stand supports the display panel on the supporting surface, the mounting plate is allowed to be retreated from the rear casing and received in the receiving portion.

17. A display device, comprising:
    a display panel having a display surface and a rear surface opposite to the display surface;
    a rear casing disposed on the display panel to enclose an accommodation space with the rear surface of the display panel, the rear casing having an opening, a vertical projection of the opening toward the display panel falling within the rear surface;
    a mounting plate partially inserted to the rear casing through the opening along the rear surface to be detachably disposed in the accommodation space; and a restricting member at least partially disposed in the accommodation space to limit movement of the mounting plate relative to the rear casing, wherein the rearing casing only covers a lower portion of the rear surface of the display panel, the rear casing has an upper surface, and the opening is located at the upper surface to allow the mounting plate to be inserted into the opening along the rear surface from up to down.

18. The display device of claim 1, wherein the screw has a first thread portion and a second thread portion located a distance away from the first thread portion; the distance corresponds to a gap between the first screw hole and the second screw hole.

19. The display device of claim 1, wherein the mounting plate has at least one mounting hole; when the mounting plate is inserted to the rear casing, the at least one mounting hole is located outside the rear casing.

* * * * *